United States Patent
Gardner et al.

(10) Patent No.: US 6,194,283 B1
(45) Date of Patent: Feb. 27, 2001

(54) HIGH DENSITY TRENCH FILL DUE TO NEW SPACER FILL METHOD INCLUDING ISOTROPICALLY ETCHING SILICON NITRIDE SPACERS

(75) Inventors: Mark I. Gardner, Cedar Creek; Robert Paiz, Austin; Thomas E. Spikes, Jr., Round Rock, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/959,587

(22) Filed: Oct. 29, 1997

(51) Int. Cl.[7] ................................................. H01L 21/76
(52) U.S. Cl. ............................................. 438/424; 438/435
(58) Field of Search ..................................... 438/424, 435, 438/437, 702; 148/DIG. 50, 510; 257/520, 622

(56) References Cited

U.S. PATENT DOCUMENTS

| | | | | |
|---|---|---|---|---|
| 4,621,414 | * | 11/1986 | Iranmanesh | 438/430 |
| 4,916,087 | * | 4/1990 | Tateoka et al. | 438/427 |
| 5,094,972 | * | 3/1992 | Pierce et al. | 438/427 |
| 5,175,122 | * | 12/1992 | Wang et al. | 438/427 |
| 5,643,823 | * | 7/1997 | Ho et al. | 438/421 |
| 5,719,085 | * | 2/1998 | Moon et al. | 438/424 |
| 5,741,740 | * | 4/1998 | Jang et al. | 438/435 |
| 5,895,253 | * | 4/1999 | Akram | 438/424 |
| 5,913,132 | * | 6/1999 | Tsai | 438/434 |

OTHER PUBLICATIONS

Stanley Wolf Ph.D. in Silicon Processing for the VLSI Era, vol. 2: Process Integration, Lattice Press, pp. 274 and 275, Jan. 1990.*

* cited by examiner

Primary Examiner—Charles Bowers
Assistant Examiner—William M. Brewster
(74) Attorney, Agent, or Firm—Kevin L. Daffer; Conley, Rose & Tayon

(57) ABSTRACT

A method for forming an isolation trench in a semiconductor substrate that is substantially free of voids. The method includes forming a dielectric masking layer above a semiconductor substrate. An opening is preferably formed through the masking layer and partially into the semiconductor substrate forming a shallow trench within the semiconductor substrate. Optionally, thermal oxidation of the trench may be performed to form an oxide layer within the trench. A spacer layer is preferably deposited across the exposed surface of the topography. The spacer layer is preferably etched to form spacers directly adjacent to opposed sidewall surfaces of the trench. The isolation trench may then be filled with an isolation dielectric. The presence of the spacers within the isolation trench preferably causes the lower portions of the trench to fill up faster than the upper portions. In this manner the trench may be filled without the formation of voids.

9 Claims, 4 Drawing Sheets

HIGH DENSITY TRENCH FILL DUE TO NEW SPACER FILL METHOD INCLUDING ISOTROPICALLY ETCHING SILICON NITRIDE SPACERS

BACKGROUND OF THE INVENTION

1. Field of the Invention

This invention relates to integrated circuit fabrication and, more particularly, to an improved process for filling shallow trench isolation structures to minimize void formation therein.

2. Description of the Relevant Art

The fabrication of an integrated circuit involves placing numerous devices in a single semiconductor substrate. Select devices are thereafter interconnected by a conductor which extends over a dielectric which separates or "isolates" the individual devices. Implementing an electrical path across a monolithic integrated circuit thereby involves selectively connecting isolated devices. When fabricating integrated circuits it must therefore be possible to isolate devices built into the substrate from one another. From this perspective, isolation technology is one of the critical aspects of fabricating a functional integrated circuit.

A popular isolation technology used for an MOS integrated circuit involves the process of locally oxidizing silicon. Local oxidation of silicon, or LOCOS, involves oxidizing field regions between devices. The oxide grown in field regions is termed field oxide, wherein field oxide is grown during the initial stages of integrated circuit fabrication, before source and drain implants are placed in device areas or active areas. By growing a thick field oxide in field regions pre-implanted with a channel-stop dopant, LOCOS processing serves to prevent the establishment of parasitic channels in the field regions.

While LOCOS has remained a popular isolation technology, there are several problems inherent with LOCOS. First, a growing field oxide extends laterally as a bird's-beak structure. In many instances, the bird's-beaks structure can unacceptably encroach into the device active area. Second, the pre-implanted channel-stop dopant often redistributes during the high temperatures associated with field oxide growth. Redistribution of channel-stop dopant primarily effects the active area periphery causing problems known as narrow-width effects. Third, the thickness of field oxide causes large elevational disparities across the semiconductor topography between field and active regions. Topological disparities cause planarity problems which become severe as circuit critical dimensions shrink. Lastly, thermal oxide growth is significantly thinner in small field (i.e., field areas of small lateral dimension) regions relative to large field regions. In small field regions, a phenomenon known as field-oxide-thinning effect therefore occurs. Field-oxide-thinning produces problems with respect to field threshold voltages, interconnect-to-substrate capacitance, and field-edge leakage in small field regions between closely spaced active areas.

Many of the problems associated with LOCOS technology are alleviated by an isolation technique known as the "shallow trench process". Despite advances made to decrease bird's-beak,channel-stop encroachment and non-planarity, it appears that LOCOS technology is still inadequate for deep sub-micron MOS technologies. The shallow trench process is better suited for isolating densely spaced active devices having field regions less than one micron in lateral dimension.

The trench process involves the steps of etching a silicon substrate surface to a relatively shallow depth, e.g., between 0.05 to 0.5 microns, and then refilling the shallow trench with a deposited dielectric. Some trench processes include an interim step of growing oxide on trench walls prior to the trench being filled with a deposited dielectric. After the trench is filled, it is then planarized to complete the isolation structure.

The trench process eliminates bird's-beak and channel-stop dopant redistribution problems. In addition, the isolation structure is fully recessed, offering at least a potential for a planar surface. Still further, field-oxide thinning in narrow isolation spaces does not occur and the threshold voltage is constant as a function of channel width.

The refilling of the isolation trench with a dielectric tends to be performed by a number of chemical vapor deposition ("CVD") techniques, including atmospheric CVD, low-pressure CVD, and plasma-enhanced CVD. The deposition of films by these methods generally exhibit good electrical and physical properties, however, silane-based CVD tends to have a number of problems. These problems may include, (i) non-conformal coverage, (ii) reentrant angles at the base of the trench, and (iii) void formation during the process of filling the trench. Void formation may occur in shallow trenches with a lateral distance at or below a 0.6 micrometer feature size. Formation of voids within these trenches tends to cause a number of problems. In particular, such voids may open up during the etchback step and subsequently trap moisture, photoresist, or metal from the next deposition. Additionally, voids tend to cause irregularities on the surface of the substrate. These non-planar regions may cause layers subsequently formed above the void to also be non-planar, leading to step coverage problems as more layers are formed.

The formation of voids may occur when deposition of a dielectric is performed on trenches with relatively high aspect ratios. Aspect ratio is defined as the ratio of depth to width. A trench having an aspect ratio of 0.5 has a depth which is half the width of the trench. Void formation typically occurs in trenches having an aspect ratio of greater than 0.8, i.e., when the trench depth approaches the width (or longer).. As depicted in FIG. 1A–1C, filling a high aspect ratio isolation trench under a number of CVD conditions may lead to void formation in the trench. As depicted in FIG. 1A, a deposition of a fill dielectric within a trench 120 may lead to unequal film thickness in which the film thickness at the top surface 110 of the substrate 100 and upper corners 112 of the trench exceeds that on the bottom 114 and lower walls 116 of the trench 120. If the sidewalls of the trench 120 are spaced close to each other, deposition of the dielectric upon the corners 112 may occur such that the corners meet before the trench is completely filled, as depicted in FIG. 1B, forming a void 118 within the isolation trench. During a subsequent etchback or polish procedure void 118 may be opened, as depicted in FIG. 1C.

It is therefore desirable to develop a technique for forming a trench isolation structure of narrow lateral distances in which the isolation structure is substantially free of voids. Such a technique is necessary to allow the formation of narrow isolation structures that are substantially free of voids that may compromise the ability of these structures to isolate the individual devices. In addition, this technique would help avoid step coverage problems in subsequent layers, which may be caused by the presence of voids.

SUMMARY OF THE INVENTION

The problems identified above are in large part addressed by the method hereof for forming isolation structures within a semiconductor substrate. That is, the present invention contemplates the formation of a trench isolation structure by using angled spacers to partially fill the trench. The angled spacers are formed laterally adjacent to the sidewall surfaces of the trench such that their exposed lateral edges are non-vertical. The trench may be subsequently filled with a dielectric such that the trench is substantially free of voids.

According to an embodiment of the present invention, a semiconductor topography is provided in which a masking layer is preferably formed above a semiconductor substrate. The masking layer may include a single layer of oxide. Alternatively the masking layer may include two layers, a pad oxide layer underlying a nitride masking layer. The oxide layer may be formed by chemical vapor deposition or thermal oxidation. An opening is formed vertically through the masking layer, and an isolation trench is then etched to a depth below the upper surface of the substrate between the sidewalls of the opening. The resulting trench is relatively shallow and narrow. Optionally, thermal oxidation of the trench may be performed to form an oxide layer along the periphery of the trench.

A spacer layer is preferably deposited across the exposed surface of the topography. The spacer layer may be made from a number of materials that exhibit low dielectric constants, K. It is preferred that the spacer layer is made from a material that is different from the material used in the masking layer. The spacer layer is preferably etched to form spacers directly adjacent to opposed sidewall surfaces of the trench. The etching may be accomplished by using an etch process, e.g., an isotropic etch which occurs both vertically and horizontally at the same rate, to give tapered profiles to the spacer structures. The spacer structures formed are preferably angled, with the width of the spacers narrowing in a direction from the bottom of the trench toward the top of the trench.

The isolation trench may then be filled with an isolation dielectric. The isolation dielectric is preferably CVD oxide. The presence of the angled spacers within the isolation trench causes the lower portions of the trench to fill faster than the upper portions. In this manner the trench may be filled without the formation of voids. Particularly, this technique may alleviate some of the problems associated with void formation in trenches such as opening up of the voids during the etchback step and step coverage problems as more layers are formed.

BRIEF DESCRIPTION OF THE DRAWINGS

Other objects and advantages of the invention will become apparent upon reading the following detailed description and upon reference to the accompanying drawings in which.

Figure 1A:
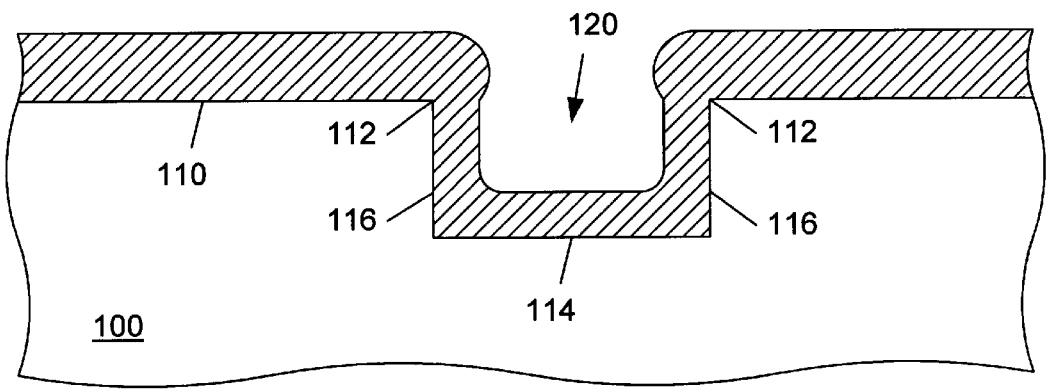
FIG. 1A is a partial cross-sectional view of a semiconductor topography, wherein an oxide layer is non-conformally deposited across a semiconductor substrate and into a trench formed in the substrate.
Figure 1B:
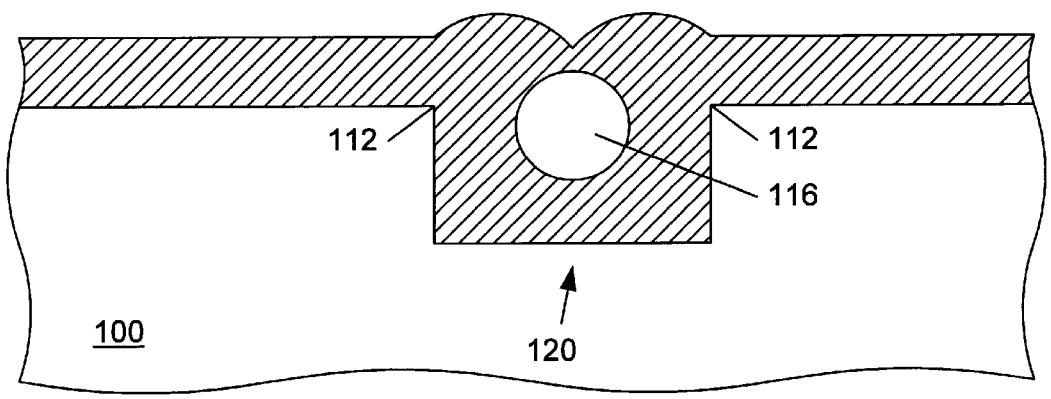
FIG. 1B is a partial cross-sectional view of a semiconductor topography, wherein a void forms as a result of depositing oxide into a trench and across a semiconductor substrate to an elevation level above the substrate.
Figure 1C:
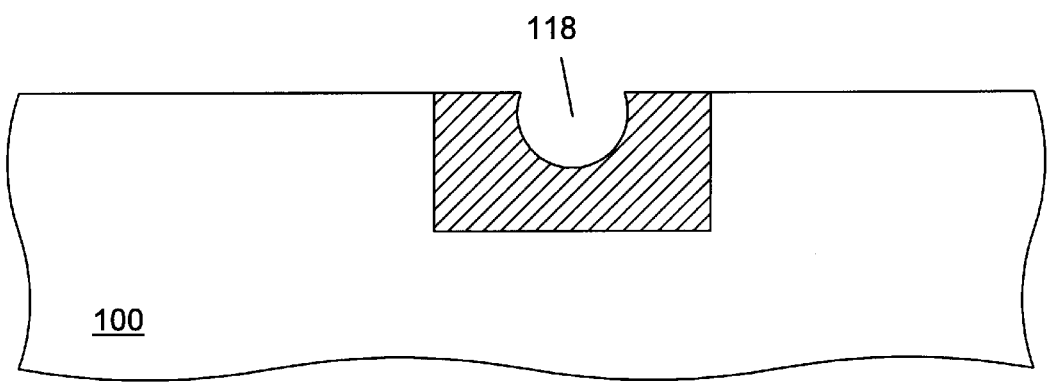
FIG. 1C is a partial cross-sectional view of a semiconductor topography wherein the oxide layer containing the void is removed to a level commensurate with the upper surface of the substrate such that an opening is formed into the oxide layer, subsequent to the step of FIG. 1B.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Figure 2A:
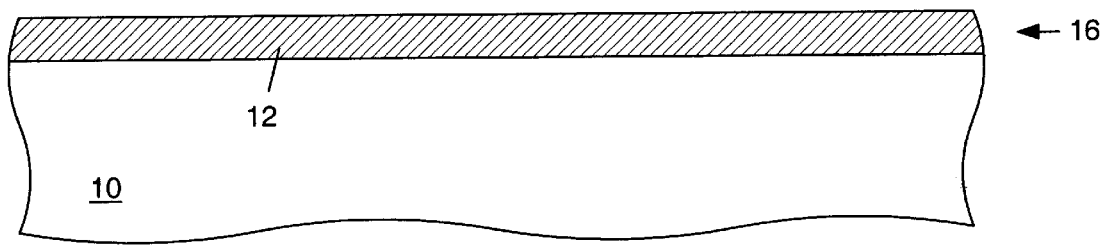
FIG. 2A is a partial cross-sectional view of a semiconductor topography, wherein an oxide masking layer is formed across a semiconductor substrate.
Figure 2B:
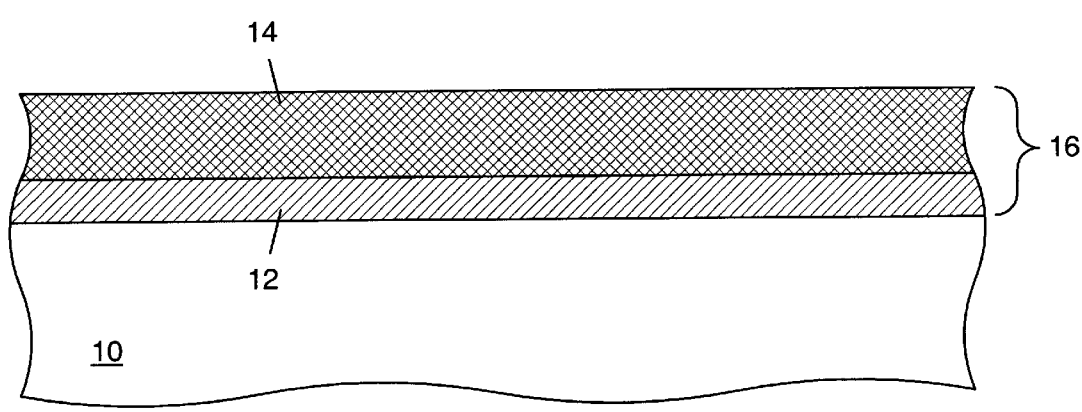
FIG. 2B is a partial cross-sectional view of a semiconductor topography, wherein a dielectric masking layer which includes a nitride layer overlying an oxide layer is formed across a semiconductor substrate, subsequent to the step of FIG. 2A.

Turning now to the drawings, FIG. 2A depicts a semiconductor substrate 10 across which a thin layer of thermally grown oxide 12 is preferably disposed. The oxide layer 12 may also be CVD deposited upon the silicon substrate 10. Semiconductor substrate 10 is preferably single crystalline silicon. As shown in FIG. 2B a dielectric layer 14, preferably nitride ($Si_3N_4$), may be deposited across oxide layer 12. The oxide deposition and the nitride deposition may be performed using, e.g., a horizontal tube LPCVD reactor. When a nitride/oxide stack, as depicted in FIG. 2B is used, the oxide layer 12 serves as a "pad oxide" to reduce inherent stresses that exist between CVD nitride on a silicon substrate. In the present invention, either the oxide layer alone, as depicted in FIG. 2A, or the oxide nitride stack, as depicted in FIG. 2B may be used as a masking layer 16 for the subsequent steps.

Figure 3:
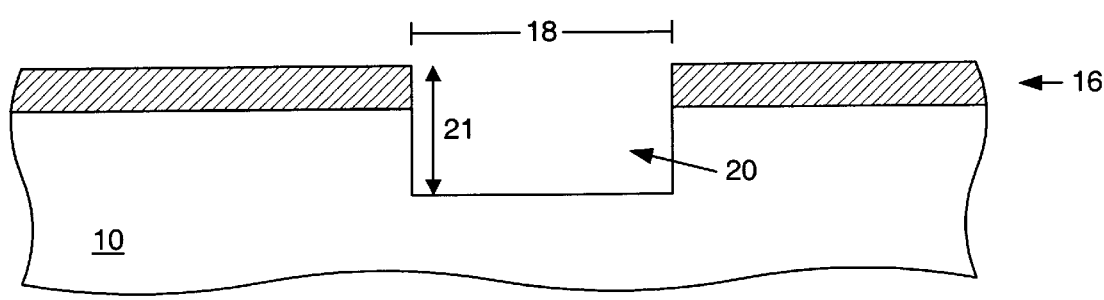
FIG. 3 is a partial cross-sectional view of a semiconductor topography, wherein an opening is etched vertically through the masking layer and partially into the semiconductor substrate to form a trench, subsequent to the step of FIG. 2A.

FIG. 3 depicts the formation of an opening 18 through the masking layer 16 and partially extending into the semiconductor substrate 10. Prior to forming the opening 18, a photoresist masking layer (not shown) may be patterned directly above the masking layer 16 to define the opening 18. Removal of the masking layer 16 and the upper elevations of substrate 10 may be achieved by e.g., a two-step dry, plasma etch. The first etch is selective to the mask material, while the second etch is selective to the silicon-based substrate. The duration of the etch is preferably chosen to terminate at the desired depth 21 for forming a shallow isolation trench 20 in the semiconductor substrate 10. Typically, the etch process is stopped when a depth of between 0.05 to 0.5 microns into the semiconductor substrate 10 has been achieved.

Figure 4:
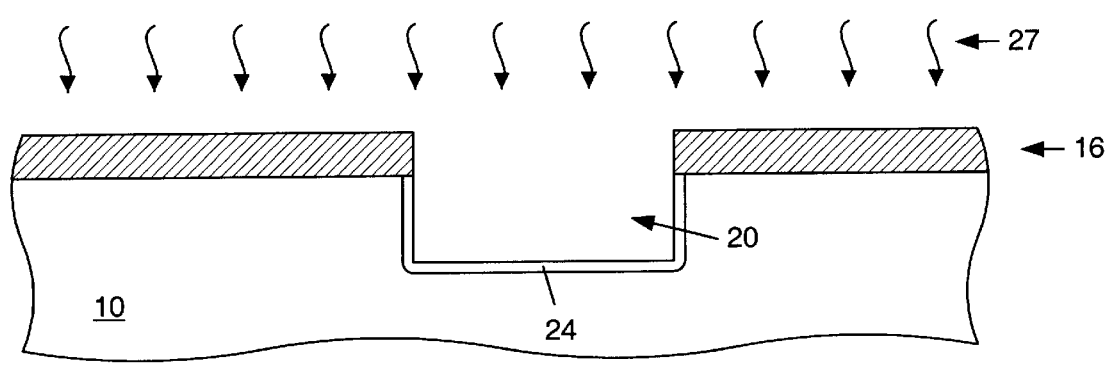
FIG. 4 is a partial cross-sectional view of a semiconductor topography, wherein an oxide layer may be thermally grown along sidewalls and a bottom of a trench, subsequent to the step of FIG. 3.

Optionally, a thermal oxide layer may be grown within the isolation trench 20, as depicted in FIG. 4. The semiconductor topography is exposed to thermal radiation 27 resulting in the oxidation of the exposed silicon within substrate 10. A thermally grown oxide layer 24 is in this manner formed upon and into the sidewalls and base of trench 20. Oxide 24 serves to terminate dangling bonds and other disruptions formed within the silicon lattice as a result of trench formation.

Figure 5:
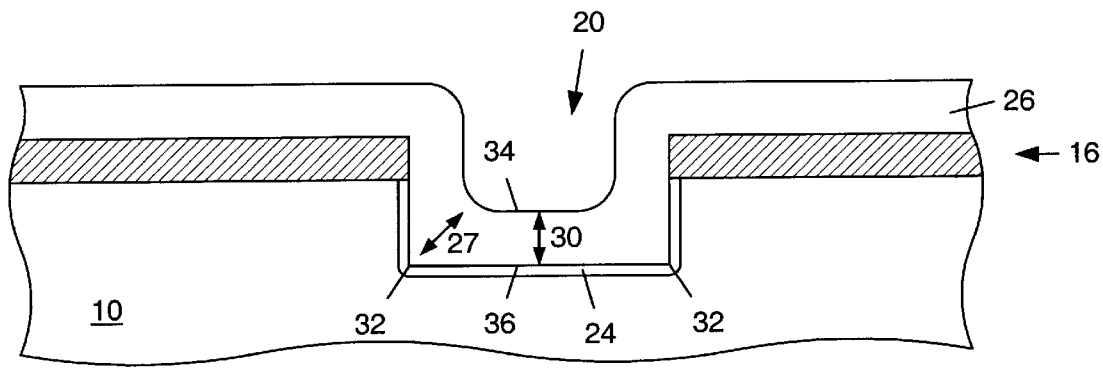
FIG. 5 is a partial cross-sectional view of a semiconductor topography, wherein a spacer layer is deposited across the exposed surface of the topography, subsequent to the step of FIG. 4.

FIG. 5 illustrates the chemical vapor deposition of a dielectric spacer layer 26 across the exposed surfaces of masking layer 16 and trench 20. Materials which may be used as the spacer layer 26 include, but are not limited to oxide, nitride, oxynitride, and a variety of low K materials. Using low K materials to form spacers minimizes the capacitive coupling between areas isolated by the ensuing trench isolation structures. Examples of low K materials include, but are not limited to fluorosilicate glass, silicon oxyfluoride, hydrogen silsesquioxane, fluorinated polysilicon, poly-phenylquinoxaline, polyquinoline, methylsilsesquioxane polymer, and fluoro-polymide. The choice of the spacer layer 26 material is partially dependent on the composition of the masking layer 16. The spacer layer 26 material is preferably different from the material used as the masking layer 16. Thus, when the masking layer 16 is oxide, the spacer layer 16 material may be any of the above mentioned materials, except for oxide. Similarly, when the masking layer 16 is an oxide/nitride stack the spacer layer 16 material may be any of the above mentioned materials, except for nitride. In this manner the spacer layer 26 material may be selectively etched without significant removal of the masking layer 16, the masking layer serving as an etch stop layer.

Figure 6:
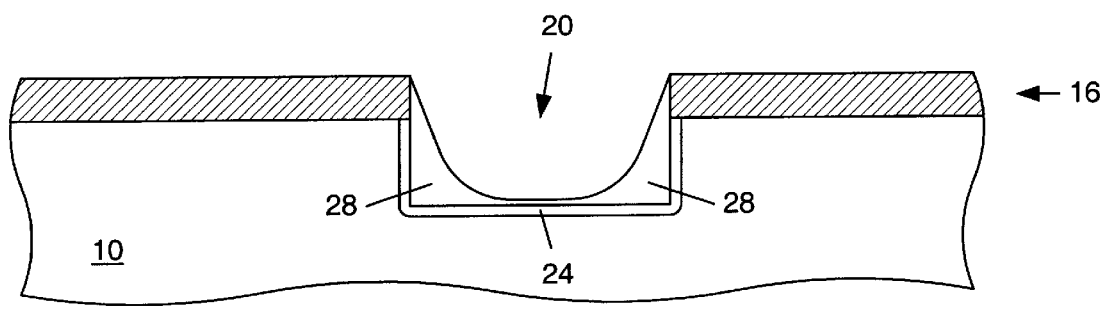
FIG. 6 is a partial cross-sectional view of a semiconductor topography, wherein the spacer layer is etched to form angled spacers adjacent to sidewalls of a trench, subsequent to the step of FIG. 5.

The spacer layer 16 may be isotropically etched to form spacers 28 which are depicted in FIG. 6. During an isotropic etch, material may be removed both vertically and horizontally at essentially the same rate. During the deposition of the spacer layer 26 the thickness 27 of the spacer layer from a corner 32 of the trench 20 to an outer surface 34 of the spacer layer may be larger than the thickness 30 from an edge 36 of the trench to the outer surface of the spacer layer, as depicted in FIG. 5. By controlling the duration of the etch process to terminate just as the masking layer 16 is reached, the spacer layer material in the corners 32 of the trench 20 will remain, forming spacers 28 as depicted in FIG. 6. The etching may be accomplished by a dry, plasma etch or a wet chemical etch procedure which is highly selective to the spacer material.

Figure 7A:
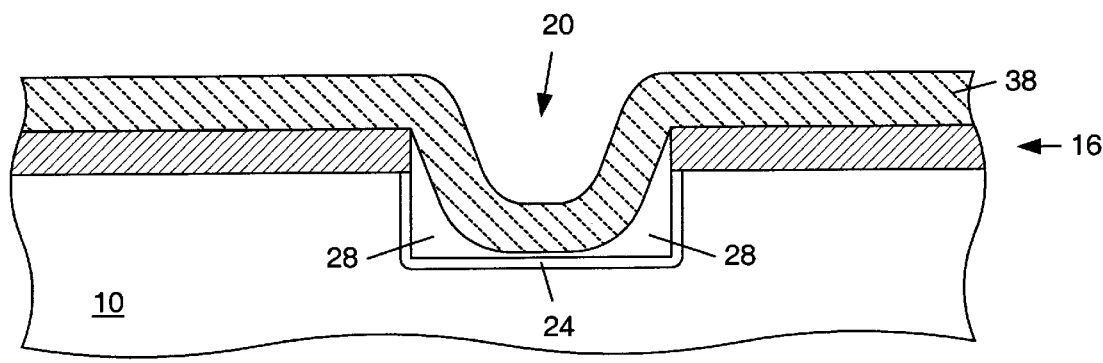
FIG. 7A is a partial cross-sectional view of a semiconductor topography, wherein a dielectric is deposited across the topography such that a trench is partially filled, subsequent to the step of FIG. 6.
Figure 7B:
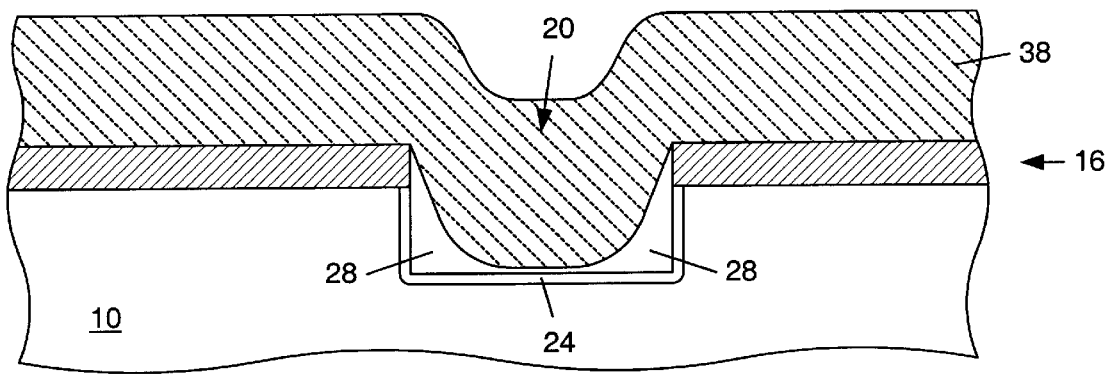
FIG. 7B is a partial cross-sectional view of a semiconductor topography, wherein the dielectric is deposited across the topography up to an elevation which is a spaced distance above the surface of the masking layer, subsequent to the step of FIG. 7A.

FIG. 7A and 7B depict the deposition of a fill dielectric material 38, e.g. CVD oxide into trench 20. The fill oxide 38 is deposited until the upper surface of the material is at an elevation above the surface of masking layer 16, as depicted in FIG. 7B. The presence of the spacers 28 within the isolation trench 20 will preferably cause the lower portions of the trench to fill up at a rate that is approximately equivalent to the rate at which the upper portions fill. Additionally, the trench 20 fills up in a direction from the bottom to the top faster than in a direction from the sidewalls. The deposition continues until the entire trench 20 is filled. Since the rates of deposition for the upper and lower portions of the trench 20 are essentially the same, due to the presence of the spacers 28 the fill oxide 38 is deposited such that the formation of voids is avoided as shown in FIG. 7B.

Figure 8:
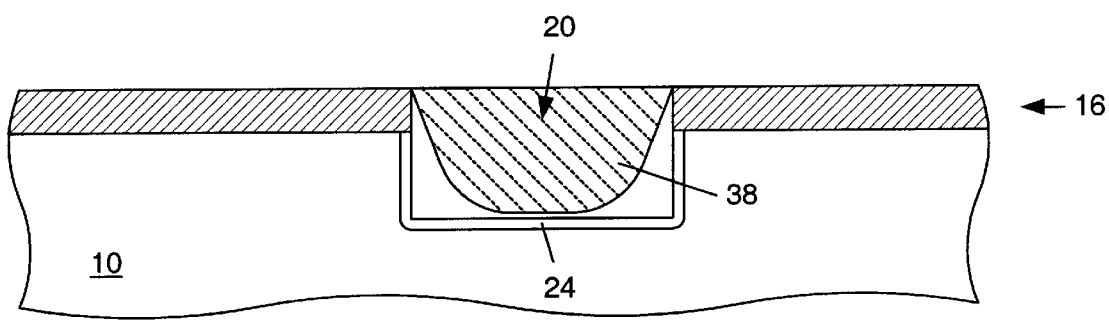
FIG. 8 is a partial cross-sectional view of a semiconductor topography, wherein a portion of the deposited dielectric is removed such that the upper surface of the dielectric is level with the surface of the masking layer, subsequent to the step in FIG. 7B.
Figure 9:
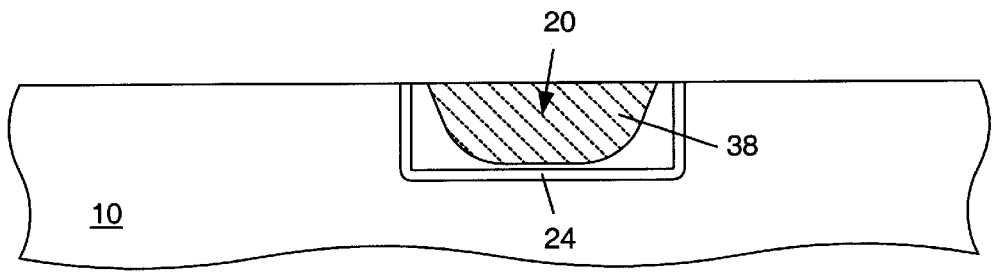
FIG. 9 is a partial cross-sectional view of a semiconductor topography, wherein the masking layer is removed and the topography planarized such that the isolation structure is level with the surface of the semiconductor substrate, subsequent to the step of FIG. 8.

Turning to FIG. 8, the formation of the isolation trench structure may be completed by chemical mechanical polishing (CMP) or a combination of etchback and/or CMP to planarize the upper surface of the fill oxide 38 such that its upper surface is commensurate with the surface of the masking layer 16. The semiconductor topography may subsequently undergo preparation for subsequent formation of transistors which are to be isolated from each other by the isolation trench structure depicted in FIG. 9. During this preparation the masking layer 16 may be removed using, e.g., various wet etch techniques, followed by chemical-mechanical polishing to planarize the semiconductor topography.

It will be appreciated to those skilled in the art having the benefit of this disclosure that this invention is capable of forming an isolation trench in a semiconductor substrate that is substantially free of voids. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method for forming a trench isolation region, comprising:

etching an isolation trench into a semiconductor substrate such that a base of the trench is spaced below a surface of the substrate;

depositing a spacer layer across the semiconductor substrate and into the trench, wherein the spacer layer comprises silicon nitride;

isotropically etching the spacer layer to form a pair of spacer structures laterally adjacent opposed sidewall surfaces of the isolation trench such that exposed lateral surfaces of said pair of spacer structures are substantially angled such that the width of the spacers structure at the base of the isolation trench is greater than a width of the spacers structure proximate the surface of the substrate, and wherein the width of the spacers structure at a position between the base of the trench and the surface of the substrate is less than a width of the spacers structure at the base;

filling the isolation trench with an isolation dielectric, wherein the spacer structures and the isolation dielectric together fill the isolation trench such that the isolation trench is substantially free of a void.

2. The method of claim 1, further comprising providing a semiconductor substrate comprising a masking layer disposed above a semiconductor substrate, wherein an opening is formed vertically through the masking layer.

3. The method of claim 2, wherein forming the masking layer comprises chemical vapor depositing silicon dioxide.

4. The method of claim 2, wherein forming the masking layer comprises thermally oxidizing the silicon substrate.

5. The method of claim 2, wherein the masking layer comprises silicon nitride, and wherein the semiconductor topography further comprises an oxide layer interposed between the semiconductor substrate and the masking layer, and wherein the opening extends through the oxide layer.

6. The method of claim 1, further comprising prior to forming the spacer structures thermally oxidizing the isolation trench such that an oxide film is thermally grown upon the sidewall surfaces and the base.

7. The method of claim 1 wherein filling the isolation trench comprises:

depositing a fill oxide across the masking layer and into the isolation trench to an elevation level spaced above the masking layer; and chemical-mechanical polishing the fill oxide to an elevation level directly below an upper surface of the masking layer.

8. The method of claim 7 wherein the depositing of fill oxide comprises chemical vapor depositing oxide.

9. The method of claim 1 wherein an aspect ratio of the trench is greater than 0.8.

* * * * *